United States Patent
Goodman et al.

(10) Patent No.: US 7,220,134 B2
(45) Date of Patent: May 22, 2007

(54) LOW PROFILE LGA SOCKET ASSEMBLY

(75) Inventors: Glenn Goodman, Cumberland, RI (US); Michael J. Murphy, East Greenwich, RI (US); Gary D. Eastman, North Kingstown, RI (US); Curtis M. Wilmot, Warwick, RI (US); Ronald R. Lambert, Johnston, RI (US)

(73) Assignee: Advanced Interconnections Corporation, West Warwick, RI (US)

( * ) Notice: Subject to any disclaimer, the term of this patent is extended or adjusted under 35 U.S.C. 154(b) by 0 days.

(21) Appl. No.: 11/065,015

(22) Filed: Feb. 24, 2005

(65) Prior Publication Data

US 2006/0189177 A1    Aug. 24, 2006

(51) Int. Cl.
*H01R 12/00*    (2006.01)

(52) U.S. Cl. ............................. 439/70; 439/71

(58) Field of Classification Search ............... 439/70, 439/71, 72, 73
See application file for complete search history.

(56) References Cited

U.S. PATENT DOCUMENTS

| | | | |
|---|---|---|---|
| 1,334,084 A | 3/1920 | Dorsey | |
| 2,453,172 A | 11/1948 | Wilkie | |
| 3,065,450 A | 11/1962 | Fieberg | |
| 3,286,671 A | 11/1966 | Fuller | |
| 3,579,282 A | 5/1971 | Couper | |
| 3,675,189 A | 7/1972 | Smith | |
| 4,442,938 A | 4/1984 | Murphy | |
| RE32,540 E | 11/1987 | Murphy | |
| 4,750,890 A | 6/1988 | Dube et al. | |
| 5,038,467 A | 8/1991 | Murphy | |
| 5,076,794 A * | 12/1991 | Ganthier | 439/70 |
| 5,088,930 A | 2/1992 | Murphy | |
| 5,151,040 A * | 9/1992 | Tanaka | 439/73 |
| 5,197,908 A | 3/1993 | Nelson | |
| 5,227,718 A | 7/1993 | Stowers et al. | |
| 5,420,519 A | 5/1995 | Stowers et al. | |
| 5,545,050 A | 8/1996 | Sato et al. | |
| 5,575,694 A | 11/1996 | Hawkins et al. | |
| 5,576,631 A | 11/1996 | Stowers et al. | |
| 5,877,554 A | 3/1999 | Murphy | |
| 6,020,635 A | 2/2000 | Murphy | |
| 6,190,181 B1 * | 2/2001 | Affolter et al. | 439/70 |
| 6,213,787 B1 | 4/2001 | Murphy | |
| 6,313,530 B1 * | 11/2001 | Murphy | 257/727 |
| 6,341,962 B1 * | 1/2002 | Sinclair | 439/66 |
| 6,352,437 B1 | 3/2002 | Tate | |
| 6,390,826 B1 * | 5/2002 | Affolter et al. | 439/70 |
| 6,471,524 B1 | 10/2002 | Nakano et al. | |
| 6,491,527 B1 * | 12/2002 | Smith | 439/66 |

* cited by examiner

*Primary Examiner*—Hae Moon Hyeon
*Assistant Examiner*—Harshad C Patel
(74) *Attorney, Agent, or Firm*—Fish & Richardson P.C.

(57) ABSTRACT

A socket terminal assembly is configured to electrically connect a contacting area of an integrated circuit with a corresponding connection region of a substrate, the socket terminal assembly comprising a socket shell including a first end configured to contact the corresponding connection region of the substrate and a second end defining a first open cavity; a pin including an end defining a second open cavity; and a coiled spring interposed between the socket shell and the pin, the spring including a first end section received within the first open cavity and a second end section received within the second open cavity.

27 Claims, 6 Drawing Sheets

LOW PROFILE LGA SOCKET ASSEMBLY

TECHNICAL FIELD

This invention relates to making connections between integrated circuit (IC) array packages and circuit boards.

BACKGROUND

Ball grid array (BGA) and land grid array (LGA) packages are becoming increasingly popular because of their low profiles and high densities. With a BGA package, for example, the rounded solder balls of the BGA are generally soldered directly to corresponding surface mount pads of a printed circuit board rather than to plated thru-holes which receive pins from, for example, a pin grid array IC package.

Sockets are used to allow particular IC packages to be interchanged without permanent connection to a circuit board. More recently, sockets for use with BGA and LGA packages have been developed to allow these packages to be non-permanently connected (e.g., for testing) to a circuit board. It is desirable that such sockets present a low-profile.

SUMMARY

In one aspect, a socket terminal assembly is configured to electrically connect a contacting area of an integrated circuit with a corresponding connection region of a substrate, the socket terminal assembly comprising a socket shell including a first end configured to contact the corresponding connection region of the substrate and a second end defining a first open cavity; a pin including an end defining a second open cavity; and a coiled spring interposed between the socket shell and the pin, the spring including a first end section received within the first open cavity and a second end section received within the second open cavity.

Embodiments of this aspect of the invention may include one or more of the following features. The first open cavity can engage the pin. The pin can include a contact spring with a plurality of spring leaves, the spring leaves defining the second open cavity. The first open cavity can receive the spring leaves and at least one of the spring leaves includes a projection engaging an inner surface of the first open cavity.

The pin can include a concave ball-contacting surface. Preferably, the pin also includes a sharp protuberance extending from the ball-contacting surface or from a outer surface of the pin.

The socket terminal assembly can have an expanded configuration in which the socket shell and the pin are spaced apart from each other and the coiled spring electrically connects the socket shell and the pin. The first end section of the coiled spring can have an unconstrained first spring diameter that exceeds an inner diameter of the first open cavity and the second end section of the coiled spring has an unconstrained second spring diameter that exceeds an inner diameter of the second open cavity. The coiled spring can also have an intermediate spring section having an intermediate spring diameter that is less than the first spring diameter of the first end section and is less than the second spring diameter of the second end section. In some embodiments, only the first end section of the coiled spring contacts the socket shell and only the second end section of the coiled spring contacts the pin.

In another aspect of the invention, an intercoupling component is configured to electrically connect contacting areas of an integrated circuit with corresponding connection regions of a substrate. The intercoupling component includes a plurality of socket shells each having a first end configured to contact the corresponding connection region of the substrate; a socket support member defining a plurality of member openings extending from a lower surface to an opposing upper surface, each opening receiving a socket shell; and a plurality of coiled springs each having a first end section having an unconstrained first spring diameter and an intermediate spring section having an intermediate spring diameter, the first spring diameter being larger than the intermediate spring diameter, each spring contacting a corresponding socket shell.

Embodiments of this aspect of the invention may include one or more of the following features. Each member opening can include a first opening section and a second opening section, a second opening diameter of the second opening section being larger than the intermediate spring diameter and smaller than the first spring diameter. Each coiled spring can be received in the corresponding member opening, the first spring section received in the first opening section with the intermediate spring section extending into the second opening section. Each socket shell can be received in the corresponding first opening section with the first spring section of the corresponding spring interposed between the socket shell and the corresponding second opening section. Each socket shell can have a second end defining a first open cavity, the first open cavity receiving the first end section of the coiled spring.

An inner diameter of the first cavity can be less than the unconstrained first spring diameter. The intercoupling component can also include a plurality of pins, each pin defining a second open cavity, the second open cavity receiving a second end section of a corresponding coiled spring.

In another aspect of the invention, a socket terminal assembly is configured to electrically connect a contacting area of an integrated circuit package with a corresponding connection region of a substrate. The socket terminal assembly includes a socket body having a first end configured to contact the corresponding connection region of the substrate and a second end with a cavity defined by at least one sidewall surface. The socket terminal assembly also includes a pin having a first end configured to be received within the cavity of the socket body and a second end adapted to contact the electrical contacting area of the integrated circuit package, the pin having a surface with a cylindrically-shaped region between the first and second ends, the cylindrically-shaped region having a resilient region in contact with the at least one sidewall surface and applying a force substantially normal to the at least one sidewall surface generating a frictional force sufficient to retain the pin within the opening of the socket body.

Embodiments of this aspect of the invention may include one or more of the following features. The resilient region can extend around the circumference of the surface of the cylindrically-shaped region of the pin. In one embodiment, the resilient region is in the form of at least one hemispherically-shaped member extending from the surface of the cylindrically-shaped region of the pin. Alternatively, the resilient region extends completely around the circumference of the surface of the cylindrically-shaped region of the pin.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
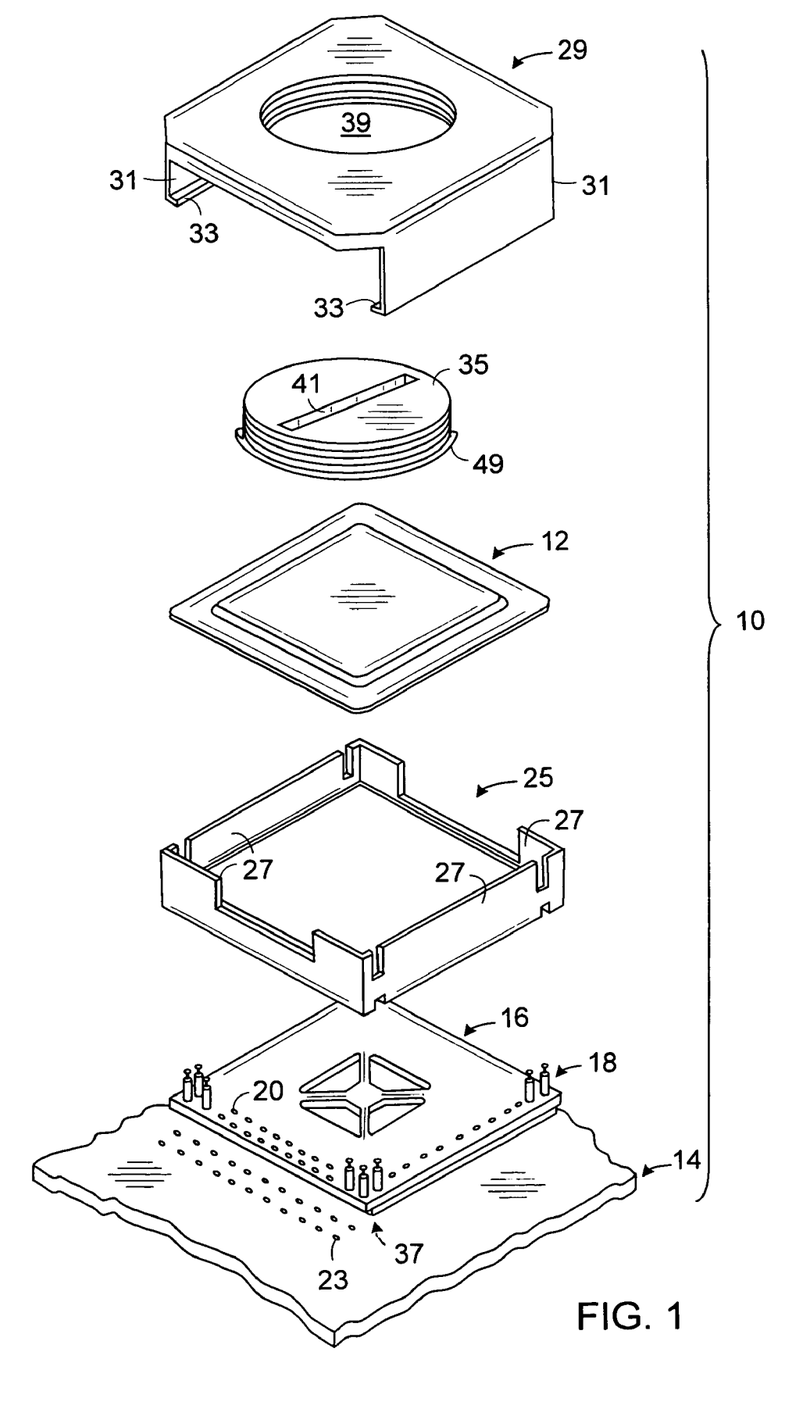
FIG. 1 is an exploded, somewhat diagrammatic view of a socket converter assembly, an integrated circuit package, and a hold-down assembly positioned over a printed circuit board.

Referring to FIG. 1, a socket converter assembly 10 serves as a component for intercoupling a integrated circuit package 12 to a printed circuit board 14. Socket converter assembly 10 includes an electrically insulative member 16 for supporting socket terminal assemblies 18, each of which is press-fit within a corresponding one of an array of holes 20 in the insulative member. The array of holes 20 are provided in a pattern corresponding to a footprint of contact areas 22 (FIGS. 2A and 2B) of integrated circuit package 12 as well as a footprint of surface mount pads 23 of printed circuit board 14. Insulative member 16 with socket terminal assemblies 18 is press-fit into a guide box 25 having sidewalls 27 along which the peripheral edges of integrated circuit package 12 are guided so that contact areas 22 are aligned over socket terminal assemblies 18. Insulative member 16 and guide box 25 may be formed as a one-piece, integral unit.

Socket converter assembly 10 also includes a hold-down cover 29 for securing the integrated circuit package 12 into the socket converter assembly. Cover 29 includes a pair of opposite walls 31 having tab members 33 which engage recessed portions 37 along the underside of insulative member 16. Hold-down cover 29 includes a threaded thru-hole 39 which threadingly receives a heat sink 35 to provide a thermal path for dissipating heat from the IC device generated within integrated circuit package 12. Heat sink 35 is inserted and backed-in from the bottom of the cover 29 and includes a lip 49 which engages a flat counterbored surface (not shown) on the bottom surface of the cover to ensure that the heat sink will contact the surface of the integrated circuit package. A slot 41 formed in the heat sink facilitates threading the heat sink within the cover, for example, with a screwdriver or coin. Other latching mechanisms (e.g., clips or catches) may also be used to secure integrated circuit packages within the socket converter assembly. It is also appreciated that other heat sink arrangements, including those with increased surface area (e.g. heat sinks with finned arrangements), may be substituted for the lower profile version shown in FIG. 1. In some applications, a heat sink may not be required with only the cover providing the downward compressing force to the integrated circuit package.

Figure 2A:
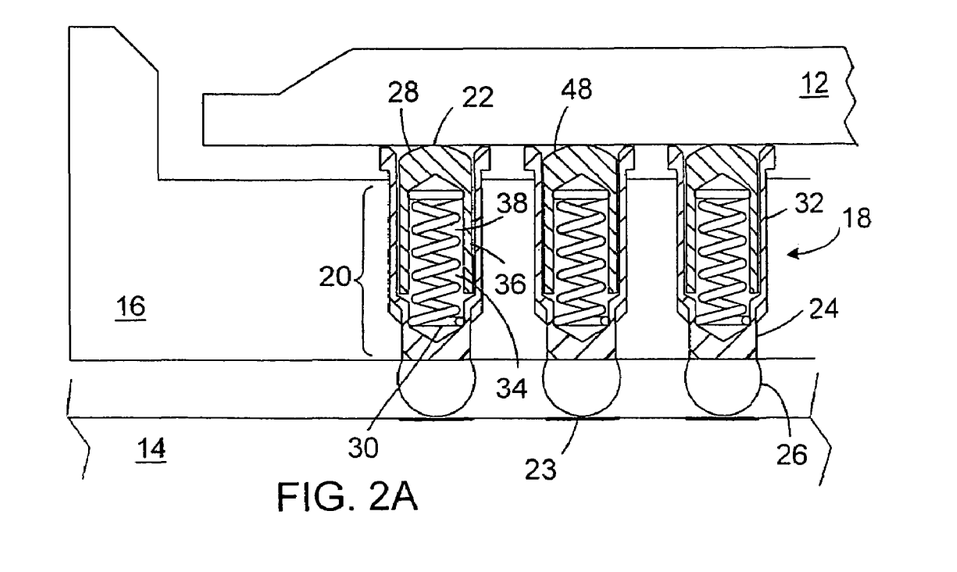
FIGS. 2A–2B are cross-sectional side views of a portion of the socket converter assembly of FIG. 1 with socket terminal assemblies each including a socket shell, a coiled spring, and a pin.
Figure 2B:
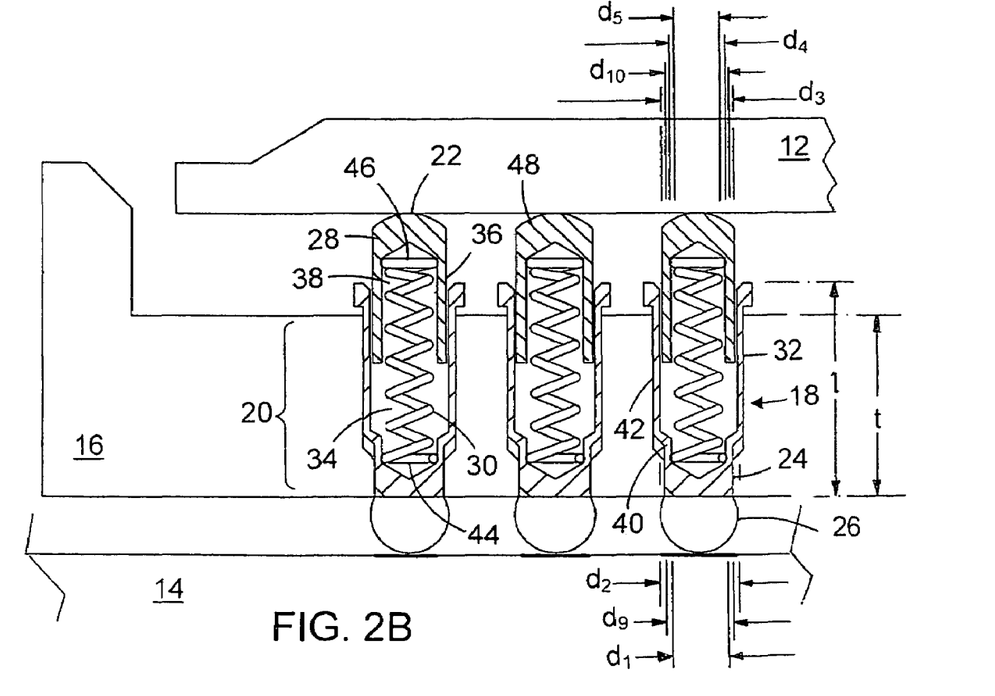

Referring to FIGS. 2A and 2B, socket terminal assemblies 18 extend upward from surface mount pads 23 of printed circuit board 14 through holes 20 to contact areas 22 of integrated circuit package 12. In this description, the directional terms upper, lower, upward, and downward are used assuming that the integrated circuit package is located "above" the substrate. This assumption and the use of these terms are for ease of description only and do not imply any limitation in the absolute vertical location of the components relative to each other. Each socket terminal assembly 18 has a socket shell 24 with an attached solder ball 26, a pin 28, and a coiled spring 30. In other embodiments, the socket terminal assemblies can have a solder tail for thru-hole applications. The upper end 32 of the socket shell 24 defines an open shell cavity 34 and the lower end 36 of the pin 28 defines an open pin cavity 38. The opening of the shell cavity 34 faces the opening of the pin cavity with the coiled spring interposed between the socket shell 24 and the pin 28.

The shell cavity 34 has a first section 40 with a first inner diameter dl of approximately 0.012 inch and a second section 42 with a second inner diameter d2 of approximately 0.017 inch. The pin 28 is generally cylindrical in shape and has an outer diameter d3 of approximately 0.016 inch. The pin 28 is at least partially received within the shell cavity 34. The pin cavity 38 has a third inner diameter d4 of approximately 0.012 inch. The lower end section 44 of the coiled spring 30 has an unconstrained first spring diameter d9 that exceeds the first inner diameter dl of the shell cavity 34. Similarly, the upper end section 46 of the spring has an unconstrained second spring diameter dl0 that exceeds the third inner diameter d4 of the pin cavity 38. The term "unconstrained spring diameter" indicates the outer diameter that a portion of a spring would have in the absence of external forces. These "diameters" are used to indicate the relative cross-sectional areas rather than to limit the described components to circular configurations.

The coiled spring 30 is press-fit between the socket shell 24 and the pin 28 which radially compresses the spring lower end section 44 to fit within the first section 40 of the socket shell 24 and the spring upper end section 46 to fit within the pin cavity 38. This produces an engagement of the coiled spring 30 with the socket shell 24 and the pin 28 that holds the socket terminal assembly 18 together even as the coiled spring 30 biases the socket shell 24 and the pin 28 away from each other. Although the spring end sections 44, 46 of this socket terminal assembly are the last coils on either end of coiled spring 30, the spring end sections in other socket terminal assemblies can include multiple, rather than single, coils.

As both the coiled spring 30 and pin 28 are received within the socket shell 24, the height of the socket terminal assembly 18 is determined by length 1 of the socket shell 24, in this case, approximately 0.047 inch. It is anticipated that this socket shell assembly can be produced with a height of less than about 0.0060 inch. The minimum height of the socket shell 24 is constrained by the thickness t of the electrically insulative member 16 which supports the socket shell 24. The electrically insulative member 16 in this embodiment is formed of a glass laminate available under tradename FR-4 from Industrial Laminates/Norplex, Inc. of Postville, Iowa and has a thickness of approximately 0.040 inch. The minimum thickness t thought to provide adequate structural support for the socket terminal assemblies 18 is approximately 0.040 inch but may be less using other materials.

Intermediate coils between the spring end sections 44, 46 have a third spring diameter d5 that is less than either the first spring diameter or the second spring diameter even if the coiled spring 30 is compressed so that the pin 28 is completely received within the socket shell 24 (see FIG. 2A). These intermediate coils typically do not engage or even touch the socket shell 24 or pin 28. Consequently, the biasing effect of the coiled spring 30 expands the socket terminal assembly 18 to compensate for minor variations in the integrated circuit package surface or vertical positioning and to maintain an electrical connection between the substrate 14 and the integrated circuit package 12 (see FIG. 2B).

Electrical current flows between the integrated circuit package 12 and substrate 14 through the pin 28, coiled spring 30, socket shell 24, and solder ball 26. The coiled spring 30 is made of Type 302 stainless steel but can be made from other materials with similar mechanical and electrical properties including, for example, beryllium-copper alloys. The head 48 of the pin 28 is a surface that contacts the predominantly flat contacting area 22 of LGA integrated circuit package 12. Under some conditions, sufficient contact occurs between the pin 28 and the socket shell 24 to advantageously provide a direct path for current to flow between these two components.

Figure 3A:
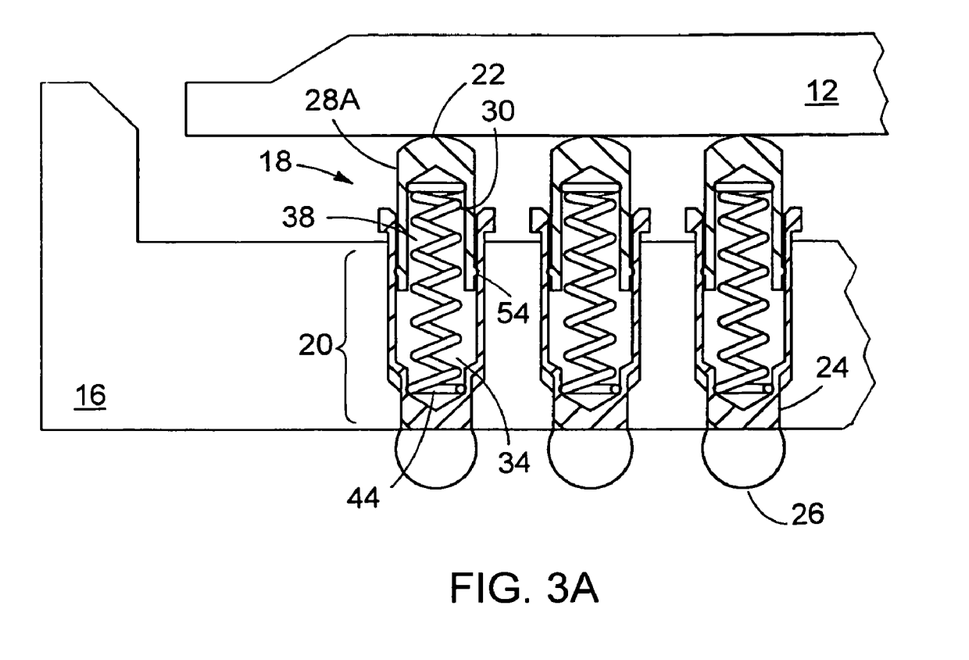
FIG. 3A is a cross-sectional side view of socket terminal assemblies with an alternate pin embodiment.
Figure 3B:
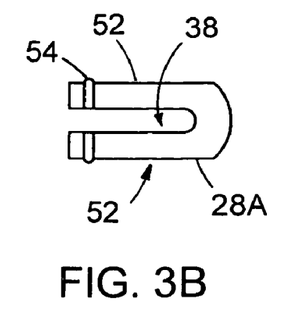
FIGS. 3B and 3C are, respectively, a side view and an end view of the pin of FIG. 3A.
Figure 3C:
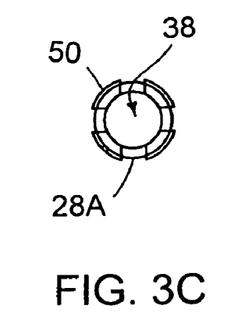

Referring to FIGS. 3A–3C, a socket terminal assembly 18 includes the features discussed above and has a pin 28A configured to increase direct contact between the socket shell 24 and the pin 28A. The pin 28A is a contact spring with four spring leaves 50 biased radially outward. The spring leaves 50 each include a main body 52 with a protrusion 54 extending radially outward from the main body 52. Socket terminal assemblies 18 can be made with alternate numbers and configurations of spring leaves 50 that facilitate electrical contact between the pin 28A and the socket shell 24.

Figure 4:
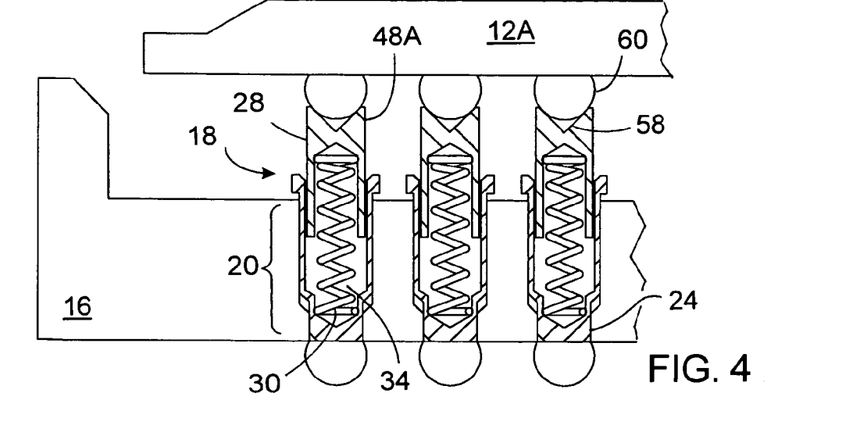
FIGS. 4–6 are cross-sectional side views of socket terminal assemblies with pins having alternate embodiments of the pin heads.
Figure 5:
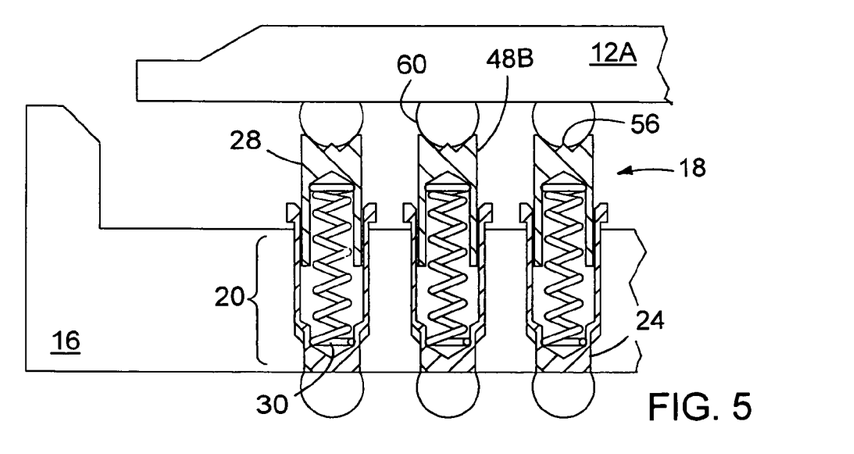
Figure 6:
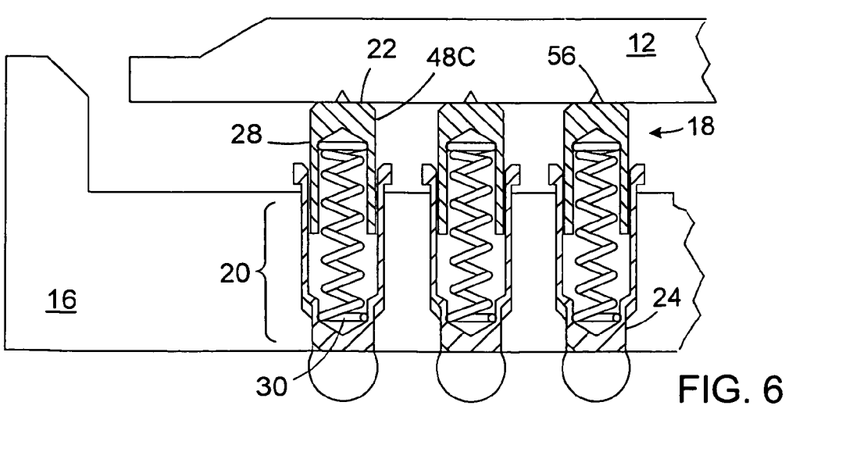

Alternate heads 48 can be provided for the pins. For example, referring to FIGS. 4 and 5, pins 28 have heads 48A, 48B each defining a concave surface 58 to receive a corresponding ball 60 of a BGA integrated circuit package 12A. Heads 48B include upwardly directed sharp protrusions 56 that can pierce materials (e.g., oxide layer) on the surface of the balls 60 to increase electrical conductivity between the pins 28 and the corresponding balls 60. Referring to FIG. 6, heads 48C for contacting a LGA integrated circuit package 12 include similar upwardly directed sharp protrusions 56 to increase electrical conductivity between the pins 28 and the contacting areas 22 of the LGA circuit package 12.

Figure 7:
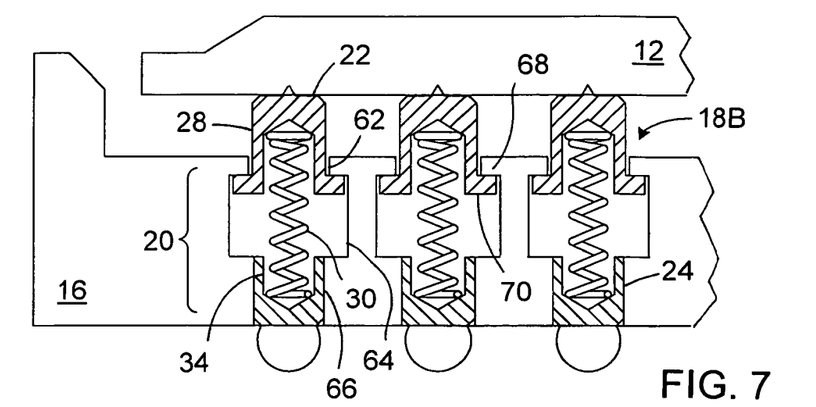
FIG. 7 is a cross-sectional side view of a portion of a socket converter assembly with a second embodiment of the socket terminal assemblies.

Referring to FIG. 7, in an alternate embodiment, each socket terminal assembly 18B has a socket shell 24 and a pin 28 that are spaced apart from each other. Consequently, the coiled spring 30 provides the sole electrical connection between the socket shell 24 and the pin 28 in this embodiment. Each hole 20, defined by the insulative member 16, has an upper portion 62, an intermediate portion 64, and a lower portion 66. The upper portion 62 has a smaller diameter than the intermediate portion 64, in effect, forming an inwardly-extending lip 68 at the upper end of the hole 20. These lips 68 limit the expansion of the socket terminal assemblies by engaging outwardly-extending tabs 70 on the lower ends of the pins 28. Consequently, press-fit engagement of the coiled springs 30 with the socket shells 24 and the pins 28 is optional in this embodiment. The lack of engagement between socket shells 24 and pins 28 enables easy assembly of socket terminal assemblies of this embodiment. However, the lips 68 increase the minimum spacing between pins (e.g., to about 0.1 millimeter).

Figure 8:
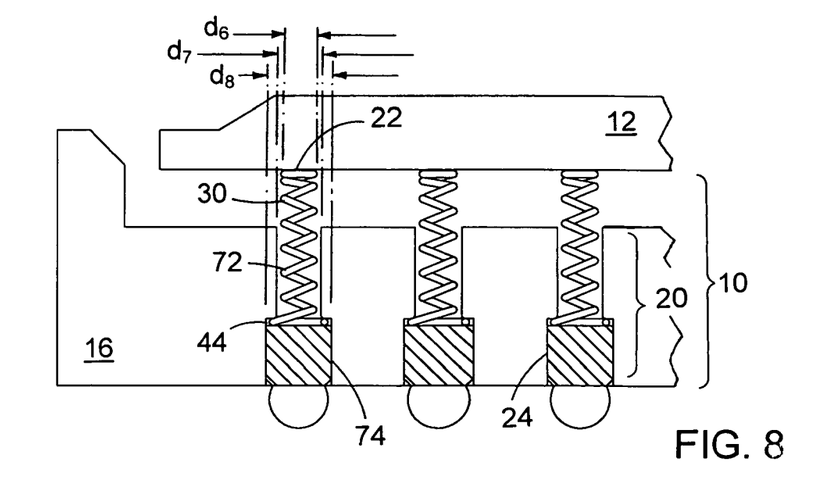
FIG. 8 is a cross-sectional side view of a portion of a socket converter assembly with a third embodiment of the socket terminal assemblies.
Figure 9:
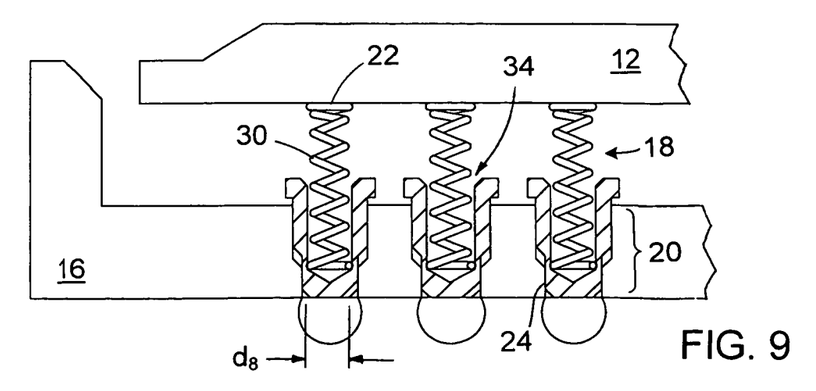
FIG. 9 is a cross-sectional side view of a portion of a socket converter assembly with a fourth embodiment of the socket terminal assemblies.

Referring to FIG. 8, in an alternate embodiment, intercoupling component 10 includes a socket support member 16 defining a plurality of holes 20 extending from its lower surface to an opposing upper surface. Each hole 20 receives a socket shell 24, having a first end configured to contact the corresponding connection region of the substrate, and a coiled spring 30. Each coiled spring 30 has a first end section 44 having an unconstrained first spring diameter (not shown) and an intermediate spring section 72 having an intermediate spring diameter d6, the first spring diameter being larger than the intermediate spring diameter. Each hole has a first opening section 74 and a second opening section 76, a second opening diameter d7 of the second opening section being larger than the intermediate spring diameter d6 and smaller than the first spring diameter d8. Each coiled spring 30 is received in the corresponding hole with the first spring section 44 received in the first opening section 74 and interposed between the corresponding socket shell 24 and the second opening section 76. The intermediate spring section 72 extends into the second opening section 76. Thus, the coiled spring 30 is secured in place between the socket shell 24 and the second opening section 76. Alternatively, referring to FIG. 9, each socket shell 24 can extend through a hole 20 with the coiled spring 30 press-fit into a socket shell 24 defining a shell cavity 34 with an inner diameter d8 less than the unconstrained first spring diameter (not shown) of the coiled spring thus frictionally securing the coiled spring to the socket shell. In use, the coiled springs 30 in these embodiments extend from corresponding socket shells 24 to contact areas 22 on the integrated circuit package 12. By having the coiled springs 30 directly contact the integrated circuit package 12, socket terminal assemblies of these embodiments require fewer parts and less assembly. However, routing electrical signals through the coiled springs 30 results in a longer signal path than can be achieved in the socket terminal assemblies of embodiments illustrated in FIGS. 2–6.

Figure 10A:
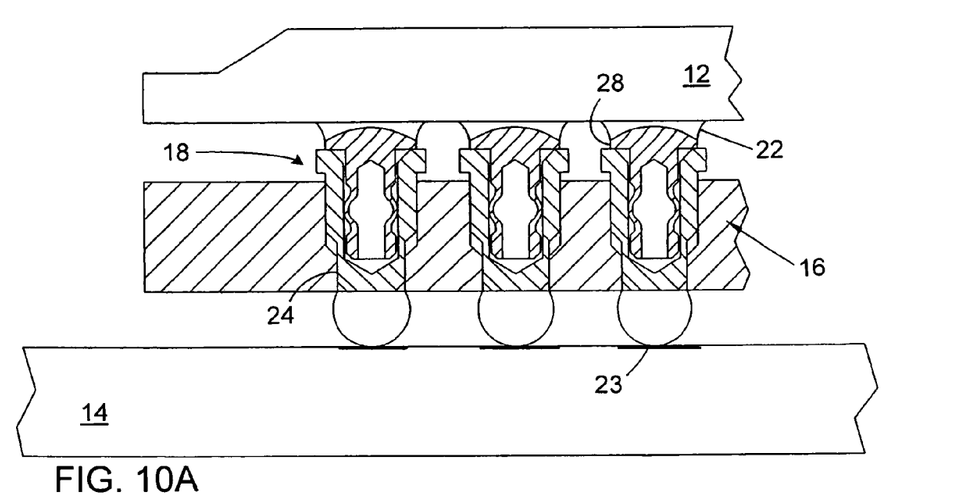
FIG. 10A is a cross-sectional side view of a portion of a socket converter assembly with a fifth embodiment of the socket terminal assemblies.
Figure 10B:
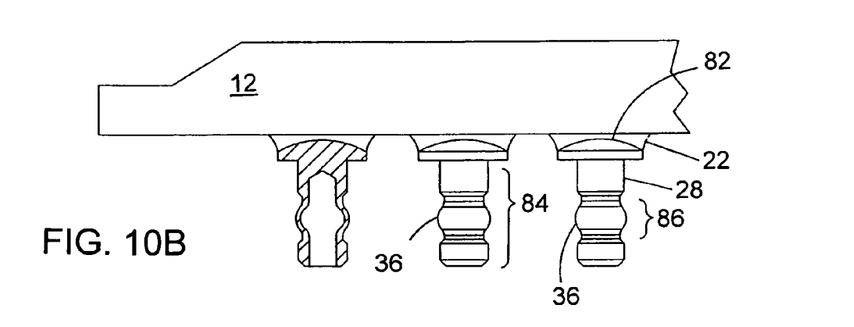
FIGS. 10B–10C are cross-sectional side views of, respectively, the pins and the socket shells of the socket terminal assemblies of FIG. 10A.
Figure 10C:
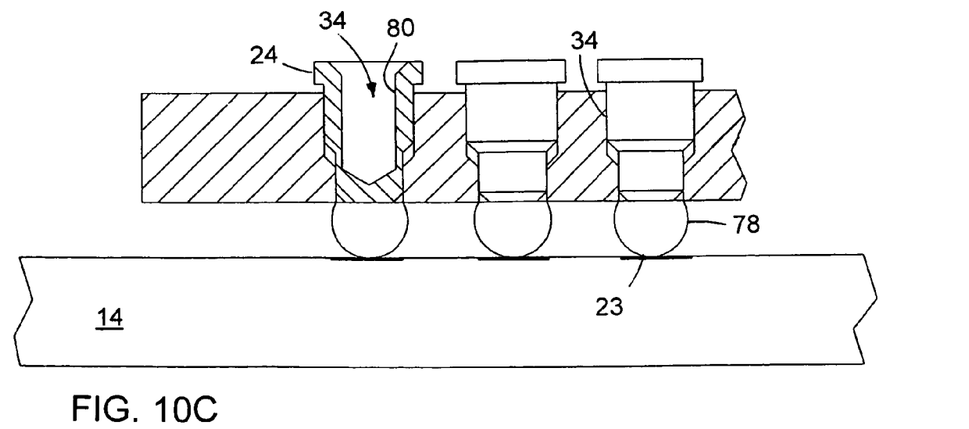

Referring to FIGS. 10A–10C, an alternate embodiment of a socket terminal assembly has a socket shell 24 and a pin 28. The socket shell 24 has a first end 78 configured to contact the corresponding connection region 23 of the substrate 14 and a second end 32 with a socket shell cavity 34 defined by at least one sidewall surface 80. The pin 28 has a first end 36 configured to be received within the socket shell cavity 34, a second end 82 adapted to contact the electrical contacting area 22 of the integrated circuit package 12, and a surface with cylindrically-shaped region 84 between the first and second ends. The cylindrically-shaped region 84 has a resilient region 86 that is configured to deform so as to apply a outwardly-directed radial force when it is press-fit within the socket shell cavity 34. This brings the resilient region 86 into contact with the at least one sidewall surface 80 and applies a force substantially normal to the at least one sidewall surface generates a frictional force sufficient to retain the pin 28 within the socket shell cavity 34. In this embodiment, the spring extends completely around the circumference of the surface of the cylindrically-shaped region of the pin. In other embodiments, the spring is in the form of a hemispherically-shaped member extending from the surface of the cylindrically-shaped region of the pin.

A number of embodiments of the invention have been described. Nevertheless, it will be understood that various modifications may be made without departing from the spirit and scope of the invention. For example, socket shells and pins can have non-circular horizontal cross-sections. Accordingly, other embodiments are within the scope of the following claims.

What is claimed is:

1. A socket terminal assembly configured to electrically connect a contacting area of an integrated circuit with a corresponding connection region of a substrate, the socket terminal assembly comprising:
   a socket shell including a first end configured to contact the corresponding connection region of the substrate and a second end defining a first open cavity;
   a pin including an end comprising a plurality of spring leaves, the end having a second open cavity; and
   a coiled spring interposed between the socket shell and the pin, the spring including a first end section received within the first open cavity and a second end section received within the second open cavity.

2. The socket terminal assembly of claim 1 wherein the first open cavity engages the pin.

3. The socket terminal assembly of claim 1 wherein the first open cavity receives the spring leaves and at least one of the spring leaves includes a projection engaging an inner surface of the first open cavity.

4. The socket terminal assembly of claim 1 wherein the pin further includes a concave ball-contacting surface.

5. The socket terminal assembly of claim 4 wherein the pin further includes a sharp protuberance extending from the ball-contacting surface.

6. The socket terminal assembly of claim 1 wherein the pin further includes a sharp protuberance extending from a outer surface of the pin.

7. The socket terminal assembly of claim 1 wherein the socket terminal assembly has an expanded configuration in which the socket shell and the pin are spaced apart from each other and the coiled spring electrically connects the socket shell and the pin.

8. The socket terminal assembly of claim 7 wherein the first end section of the coiled spring has an unconstrained first spring diameter that exceeds an inner diameter of the first open cavity and the second end section of the coiled spring has an unconstrained second spring diameter that exceeds an inner diameter of the second open cavity.

9. The socket terminal assembly of claim 8 wherein the coiled spring further includes an intermediate spring section having an intermediate spring diameter that is less than the first spring diameter of the first end section and is less than the second spring diameter of the second end section.

10. The socket terminal assembly of claim 9 wherein only the first end section of the coiled spring contacts the socket shell and only the second end section of the coiled spring contacts the pin.

11. An intercoupling component configured to electrically connect contacting areas of an integrated circuit with corresponding connection regions of a substrate, the intercoupling component comprising:
   a plurality of socket shells each having a first end configured to contact the corresponding connection region of the substrate;
   a socket support member defining a plurality of member openings extending from a lower surface to an opposing upper surface, each opening receiving a socket shell; and
   a plurality of coiled springs each having a first end section having an unconstrained first spring diameter and an intermediate spring section having an intermediate spring diameter, the first spring diameter being larger than the intermediate spring diameter, each spring contacting a corresponding socket shell.

12. The intercoupling component of claim 11 wherein each member opening includes a first opening section and a second opening section, a second opening diameter of the second opening section being larger than the intermediate spring diameter and smaller than the first spring diameter.

13. The intercoupling component of claim 12 wherein each coiled spring is received in the corresponding member opening, the first spring section received in the first opening section with the intermediate spring section extending into the second opening section.

14. The intercoupling component of claim 13 wherein each socket shell is received in the corresponding first opening section with the first spring section of the corresponding spring interposed between the socket shell and the corresponding second opening section.

15. The intercoupling component of claim 11 wherein each socket shell has a second end defining a first open cavity, the first open cavity receiving the first end section of the coiled spring.

16. The intercoupling component of claim 15 wherein an inner diameter of the first cavity is less than the unconstrained first spring diameter.

17. The intercoupling component of claim 16 further comprising a plurality of pins, each pin defining a second open cavity, the second open cavity receiving a second end section of a corresponding coiled spring.

18. A socket terminal assembly configured to electrically connect a contacting area of an integrated circuit package with a corresponding connection region of a substrate, the socket terminal assembly comprising:
   a socket body having a first end configured to contact the corresponding connection region of the substrate and a second end with a cavity defined by at least one sidewall surface; and
   a pin having a first end configured to be received within the cavity of the socket body and a second end adapted to contact the electrical contacting area of the integrated circuit package, the pin having a surface with a cylindrically-shaped region between the first and second ends, the cylindrically-shaped region having a resilient region in contact with the at least one sidewall surface and applying a force substantially normal to the at least one sidewall surface generating a frictional force sufficient to retain the pin within the opening of the socket body.

19. The socket terminal assembly of claim 18 wherein the resilient region extends around the circumference of the surface of the cylindrically-shaped region of the pin.

20. The socket terminal assembly of claim 19 wherein the resilient region is in the form of at least one hemispherically-shaped member extending from the surface of the cylindrically-shaped region of the pin.

21. The socket terminal assembly of claim 19 wherein the resilient region extends completely around the circumference of the surface of the cylindrically-shaped region of the pin.

22. A socket terminal assembly configured to electrically connect a contacting area of an integrated circuit with a corresponding connection region of a substrate, the socket terminal assembly comprising:
- a socket shell including a first end configured to contact the corresponding connection region of the substrate and a second end defining a first open cavity;
- a pin including an end having a second open cavity; and
- a coiled spring interposed between the socket shell and the pin, the spring including a first end section received within the first open cavity, the first end section of the coiled spring having an unconstrained first spring diameter that exceeds an inner diameter of the first open cavity, and a second end section received within the second open cavity, the second end section of the coiled spring has an unconstrained second spring diameter that exceeds an inner diameter of the second open cavity;
- wherein the socket terminal assembly has an expanded configuration in which the socket shell and the pin are spaced apart from each other and the coiled spring electrically connects the socket shell and the pin.

23. The socket terminal assembly of claim 22 wherein the first open cavity engages the pin.

24. The socket terminal assembly of claim 23 wherein the pin includes a contact spring with a plurality of spring leaves, the spring leaves defining the second open cavity.

25. The socket terminal assembly of claim 24 wherein the first open cavity receives the spring leaves and at least one of the spring leaves includes a projection engaging an inner surface of the first open cavity.

26. The socket terminal assembly of claim 22 wherein the coiled spring further includes an intermediate spring section having an intermediate spring diameter that is less than the first spring diameter of the first end section and is less than the second spring diameter of the second end section.

27. The socket terminal assembly of claim 26 wherein only the first end section of the coiled spring contacts the socket shell and only the second end section of the coiled spring contacts the pin.

* * * * *